US009912248B2

(12) United States Patent
Shimazu et al.

(10) Patent No.: US 9,912,248 B2
(45) Date of Patent: Mar. 6, 2018

(54) POWER MODULE

(71) Applicant: Hitachi Automotive Systems, Ltd., Hitachinaka-shi, Ibaraki (JP)

(72) Inventors: Hiromi Shimazu, Tokyo (JP); Kinya Nakatsu, Tokyo (JP); Kouji Sasaki, Tokyo (JP); Takahiro Shimura, Hitachinaka (JP); Hisashi Tanie, Tokyo (JP)

(73) Assignee: Hitachi Automotive Systems, Ltd., Hitachinaka-shi (JP)

( * ) Notice: Subject to any disclaimer, the term of this patent is extended or adjusted under 35 U.S.C. 154(b) by 0 days.

(21) Appl. No.: 15/325,310

(22) PCT Filed: Jul. 1, 2015

(86) PCT No.: PCT/JP2015/068937
§ 371 (c)(1),
(2) Date: Jan. 10, 2017

(87) PCT Pub. No.: WO2016/021341
PCT Pub. Date: Feb. 11, 2016

(65) Prior Publication Data
US 2017/0187300 A1 Jun. 29, 2017

(30) Foreign Application Priority Data
Aug. 7, 2014 (JP) ................................. 2014-160942

(51) Int. Cl.
*H02K 11/33* (2016.01)
*H02M 7/537* (2006.01)
(Continued)

(52) U.S. Cl.
CPC ......... *H02M 7/003* (2013.01); *B60L 11/1803* (2013.01); *H02K 11/33* (2016.01);
(Continued)

(58) Field of Classification Search
CPC .... H02M 7/003; H02M 7/537; H05K 5/0017; H05K 7/20218; H02K 11/33; B60L 11/1803
(Continued)

(56) References Cited

U.S. PATENT DOCUMENTS 5,552,635 A 9/1996 Kim et al.
7,504,720 B2 * 3/2009 Nakatsu .............. H01L 23/3675
257/712
(Continued)

FOREIGN PATENT DOCUMENTS

JP 7-254668 A 10/1995
JP 2007-53295 A 3/2007
(Continued)

OTHER PUBLICATIONS

International Search Report (PCT/ISA/210) issued in PCT Application No. PCT/JP2015/068937 dated Sep. 29, 2015 with English translation (five pages).
(Continued)

*Primary Examiner* — Timothy Thompson
*Assistant Examiner* — Michael F McAllister
(74) *Attorney, Agent, or Firm* — Crowell & Moring LLP

(57) ABSTRACT

An object of the present invention is to provide a power module having high reliability. The power module according to the present invention, includes a circuit body and a case housing the circuit body. The case has a first case member including a first base plate and a second case member including a second base plate. The first case member has a first side wall portion formed in an arrangement direction of the first base plate and the second base plate. The second case member has a second side wall portion formed in the arrangement direction, the second side wall portion coupling to the first side wall portion. The first side wall portion and
(Continued)

A-A' SECTIONAL VIEW the second wall portion are formed so as to have the sum of lengths of the first side wall portion and the second side wall portion in the arrangement direction smaller than the thickness of the circuit body. The first case member has a deforming portion smaller than the first base plate and the second base plate in rigidity.

7 Claims, 14 Drawing Sheets

(51) Int. Cl.
*H02M 7/00* (2006.01)
*H05K 5/00* (2006.01)
*H05K 7/20* (2006.01)
*B60L 11/18* (2006.01)

(52) U.S. Cl.
CPC .......... *H02M 7/537* (2013.01); *H05K 5/0017* (2013.01); *H05K 7/20218* (2013.01)

(58) Field of Classification Search
USPC ........................................................ 361/752
See application file for complete search history.

(56) References Cited

U.S. PATENT DOCUMENTS

| | | | | |
|---|---|---|---|---|
| 7,745,952 | B2 * | 6/2010 | Nakatsu ................ | B60L 11/08 257/706 |
| 9,474,191 | B2 * | 10/2016 | Higuma ................ | H02M 7/003 |
| 9,497,873 | B2 * | 11/2016 | Takagi ................ | H02M 7/003 |
| 2007/0096278 | A1 | 5/2007 | Nakatsu et al. | |
| 2013/0062751 | A1 | 3/2013 | Takagi et al. | |
| 2013/0328185 | A1 | 12/2013 | Hiramitsu et al. | |

FOREIGN PATENT DOCUMENTS

| | | |
|---|---|---|
| JP | 2011-233606 A | 11/2011 |
| JP | 2012-178484 A | 9/2012 |
| JP | 2013-51363 A | 3/2013 |
| JP | 2013-143439 A | 7/2013 |
| JP | 2013-255424 A | 12/2013 |

OTHER PUBLICATIONS

German-language Written Opinion (PCT/ISA237) issued in PCT Application No. PCT/JP2015/068937 dated Sep. 29, 2015 (three pages).

* cited by examiner

B-B' SECTIONAL VIEW

B-B' SECTIONAL VIEW

POWER MODULE

TECHNICAL FIELD

The present invention relates to a power module, and particularly relates to a power module used for a power conversion device that controls a motor for vehicular drive.

BACKGROUND ART

A power conversion device including a power module having a power semiconductor module housed in a metal-made case having a heat dissipating unit, has been known. For example, electric vehicles, such as electric motor vehicles or hybrid motor vehicles, are equipped with this type of power conversion device.

The power semiconductor module is sealed with resin in a state where both front and back surfaces of a power semiconductor element have been soldered to conductive plates and electrode terminals have been exposed. The metal-made case has heat dissipating units to be attached to the respective conductive plates with an insulating adhesive having thermal conductivity, on both sides thereof. Each of the heat dissipating units includes a plurality of fins for dissipating heat, formed thereon. The metal-made case has a bottomed-can-shape including an opening on the side of one side end portion, with a flange portion. The power semiconductor module is housed in the metal-made case in a state where the electrode terminals of the power semiconductor element have been inserted through the opening of the metal-made case.

This metal-made case has a structure having a frame and two fin plates each including the plurality of fins formed, joined to each other. The frame includes openings facing front and back surfaces of a circuit body including the power semiconductor elements sealed with the adhesive, formed thereon. The openings include the pair of fin plates each having the plurality of fins, arranged and joined therein (for example, refer to PTL 1).

In this type of power semiconductor device, it is necessary to release heat generated by the power semiconductor element during conducting operation, to the exterior through a heat dissipating member. Therefore, when tensile stress occurs in the insulating adhesive under operating conditions in which thermal cycles are loaded, there is a risk that detachment occurs at a coupling interface. Therefore, a technique of causing compressive stress to remain in the insulating adhesive, has been disclosed (for example, refer to PTL 2).

CITATION LIST

Patent Literature

PTL 1: JP 2013-51363 A
PTL 2: JP 2011-233606 A

SUMMARY OF INVENTION

Technical Problem

However, in order to cause compressive stress to remain in a circuit body sealed with resin in a state where both front and back surfaces of a power semiconductor element has been soldered to conductive plates and electrode terminals have been exposed, a power semiconductor module described in PTL 2 includes a distance between fin plates of a metal-made case, formed smaller than the thickness of the circuit body. When the circuit body is inserted into the metal case, it is necessary to widen the case to dimensions into which the circuit body can be put. There is a possibility that pressing force of a fin base portion varies (decreases) during this process. Thus, it is difficult to generate desired compressive stress stably.

Therefore, an object of the present invention is to provide a power module having high reliability by causing desired compressive stress to remain stably in an insulating layer and inhibiting a heat dissipating unit from being apart from a power semiconductor module.

Solution to Problem

In order to solve the above problem, a power module according to the present invention, includes: a circuit body having a power semiconductor element; and a case housing the circuit body. The case has: a first case member including a first base plate facing one surface of the circuit body; and a second case member including a second base plate facing another surface on a side opposite to the one surface of the circuit body. The first case member has a first side wall portion formed in an arrangement direction of the first base plate and the second base plate. The second case member has a second side wall portion formed in the arrangement direction, the second side wall portion coupling to the first side wall portion. The first side wall portion and the second side wall portion are formed so as to have a sum of lengths of the first side wall portion and the second side wall portion in the arrangement direction smaller than a thickness of the circuit body. The first case member has a deforming portion smaller than the first base plate and the second base plate in rigidity.

Advantageous Effects of Invention

Heat dissipation capable of inhibiting separation from a power semiconductor unit improves so that reliability can be improved.

DESCRIPTION OF EMBODIMENTS

First Embodiment

[Power Conversion Device]

A power conversion device according to one embodiment of the present invention will be described below with reference to the drawings.

Figure 1:
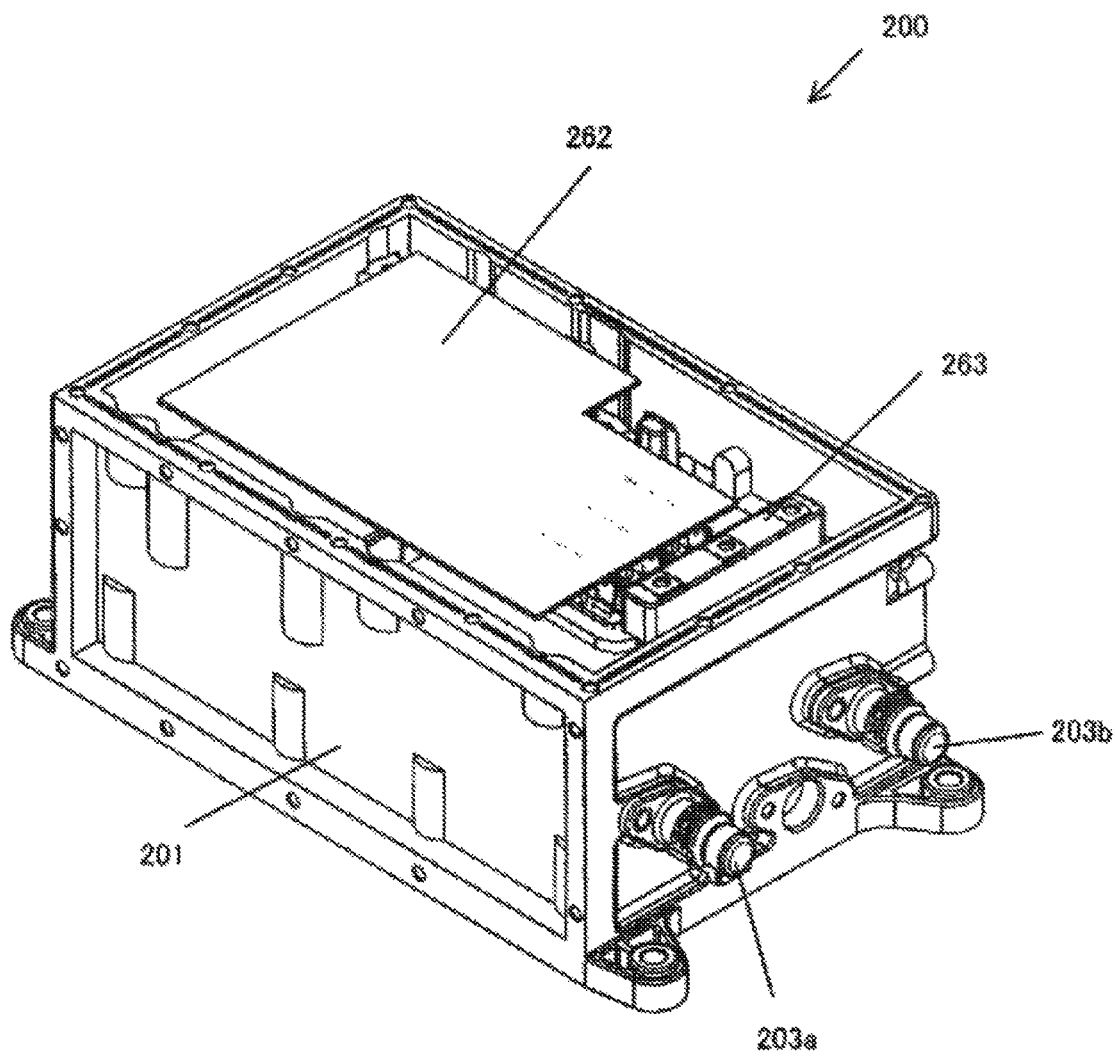
FIG. 1 is an outer perspective view of a power conversion device according to one embodiment of the present invention.
Figure 2:
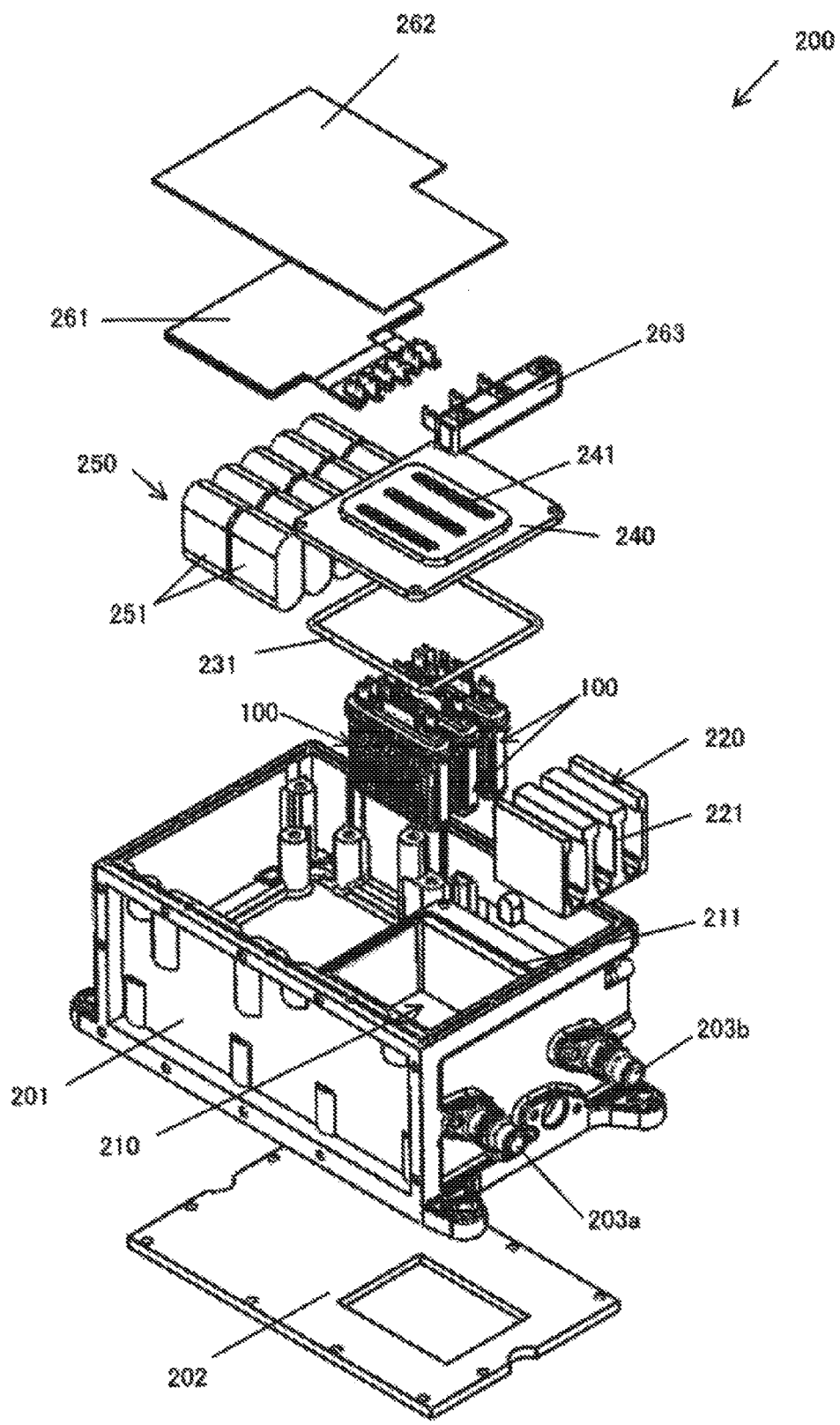
FIG. 2 is an exploded perspective view of the power conversion device illustrated in FIG. 1.

FIG. 1 is an outer perspective view of the power conversion device according to the one embodiment of the present invention. FIG. 2 is an exploded perspective view of the power conversion device illustrated in FIG. 1.

The power conversion device 200 is used for a power supply device of an electric motor vehicle or a hybrid motor vehicle. Not to be illustrated, the power conversion device 200 has an inverter circuit coupled to a motor generator, built therein. The power conversion device 200 also includes a booster circuit coupled to an external battery, and a control circuit that controls the entirety.

The power conversion device 200 has a housing main body 201 formed of aluminum-based metal, such as aluminum or aluminum alloy, and a bottom cover 202 fastened to the housing main body 201 with fastening members (not illustrated). The housing main body 201 and the bottom cover 202 can be formed by integral molding. An upper cover, not illustrated, is fastened to an upper portion of the housing main body 201 with fastening members so that a case is hermetically formed.

Peripheral walls 211 for forming a cooling channel are formed and a cooling chamber 210 is formed with the peripheral walls 211 and the bottom cover 202, inside the housing main body 201.

A supporting member 220 having a plurality of side walls 221 (four in FIG. 2), and a plurality of power modules 100 (three in FIG. 2) to be arranged between the respective side walls 221, are housed in the cooling chamber 210. Details of the power modules 100 will be described later.

A pair of through holes is provided to one side portion of the housing main body 201. An inlet pipe 203a is provided to one of the through holes. An outlet pipe 203b is provided to the other of the through holes. A cooling medium, such as cooling water, flows into the cooling chamber 210 through the inlet pipe 203a, flows through cooling passages between the side walls 221 of the supporting member 220 and the respective power modules 100, and flows out of the outlet pipe 203b. The cooling medium that has flowed out of the outlet pipe 203b, is refrigerated by a cooling device, such as a radiator, not illustrated, and then circulates so as to flow into the cooling chamber 210 through the inlet pipe 203a again.

The cooling chamber 210 is sealed with a covering member 240 through a sealing member 231. The covering member 240 has openings 241 each through which a direct-current positive electrode terminal 35a of a power semiconductor element built in a power semiconductor module, housed in each of the power modules 100 is inserted. Peripheral edge portions of the covering member 240 are fixed to upper portions of the peripheral walls 211 forming the cooling chamber 210, with fastening members not illustrated.

A capacitor module 250 including a plurality of capacitor elements 251 for smoothing direct-current power to be supplied to the inverter circuit, is housed in an outside region of the cooling chamber 210 of the housing main body 201.

A direct-current side bus bar assembly 261 is arranged on upper portions of the capacitor module 250 and the power modules 100. The direct-current side bus bar assembly 261 transmits the direct-current power between the capacitor module 250 and the power modules 100.

A control circuit board assembly 262 including a driver circuit unit that controls the inverter circuit, is arranged above the direct-current side bus bar assembly 261 and the covering member 240.

An alternating-current side bus bar assembly 263 is coupled to the power modules 100 so as to transmit alternating-current power. The alternating-current side bus bar assembly 263 has a current sensor.

[Power Module 100]

The power modules 100 will be described with reference to FIGS. 3 to 10 and FIGS. 14 to 18.

Figure 3:
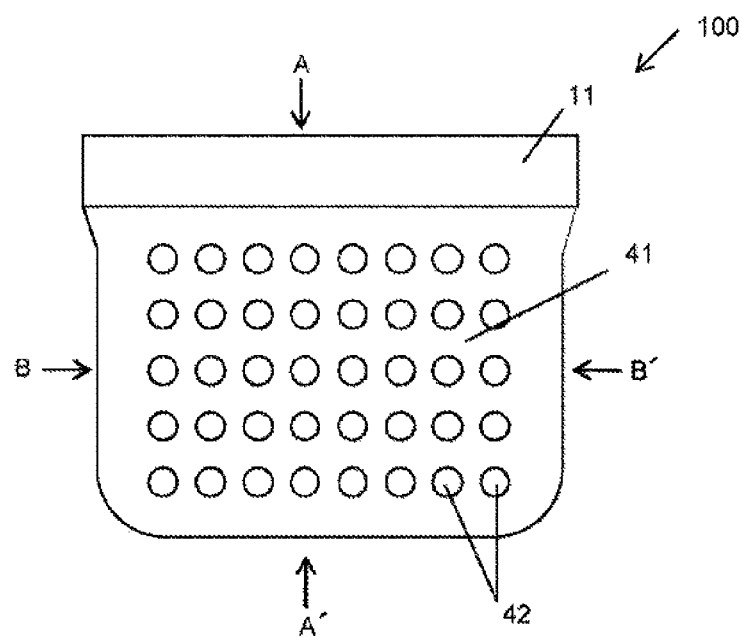
FIG. 3 is an outer plan view of a power module illustrated in FIG. 2.
Figure 4:
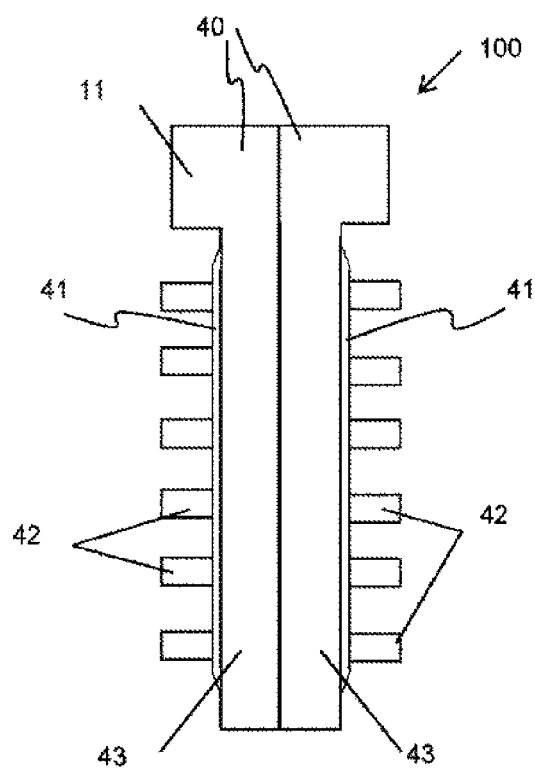
FIG. 4 is an outer side view of the power module illustrated in FIG. 2.
Figure 5:
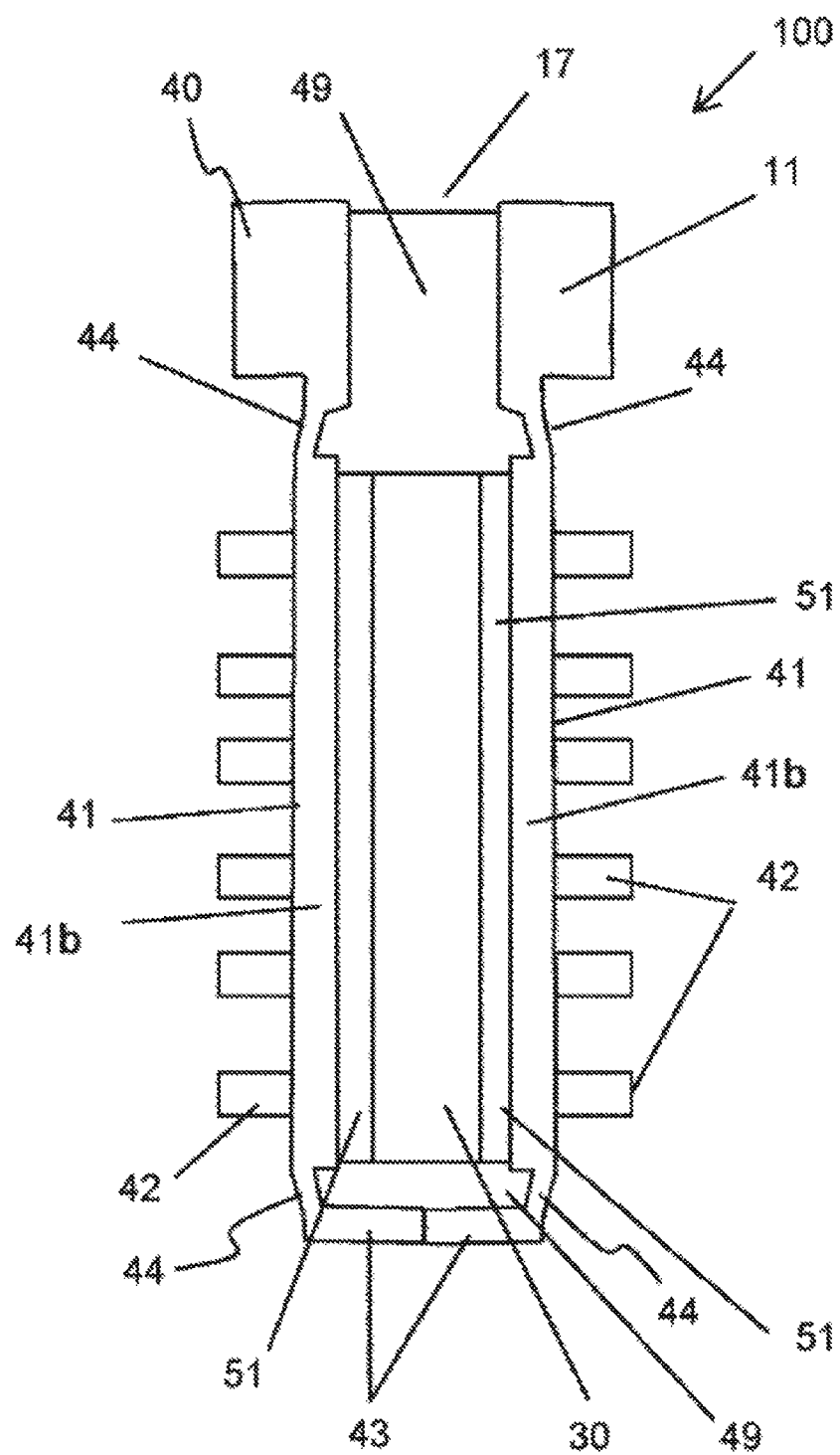
FIG. 5 is a longitudinal sectional view taken along line A-A' of the power module illustrated in FIG. 3.
Figure 6:
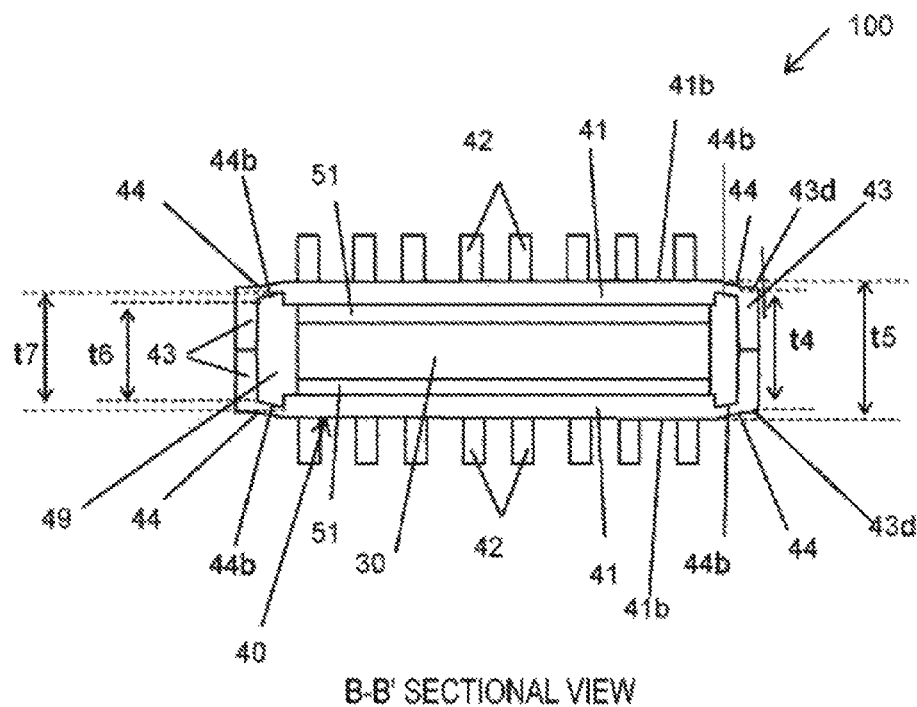
FIG. 6 is a cross sectional view taken along line B-B' of the power module illustrated in FIG. 3.
Figure 7:
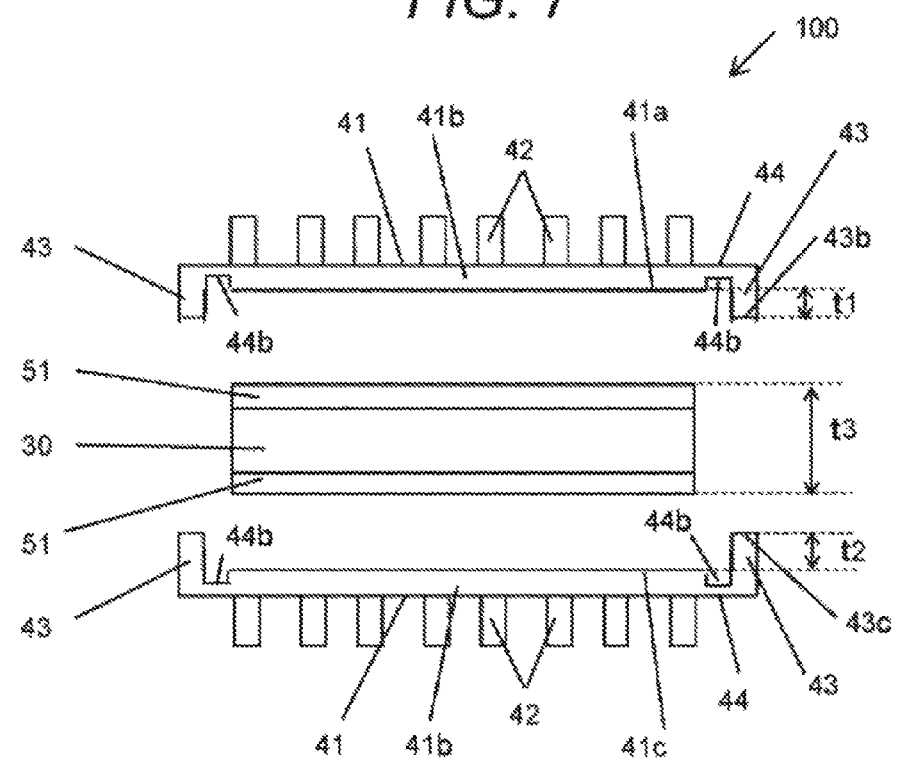
FIG. 7 is an exploded sectional view of the power module illustrated in FIG. 6.
Figure 8:
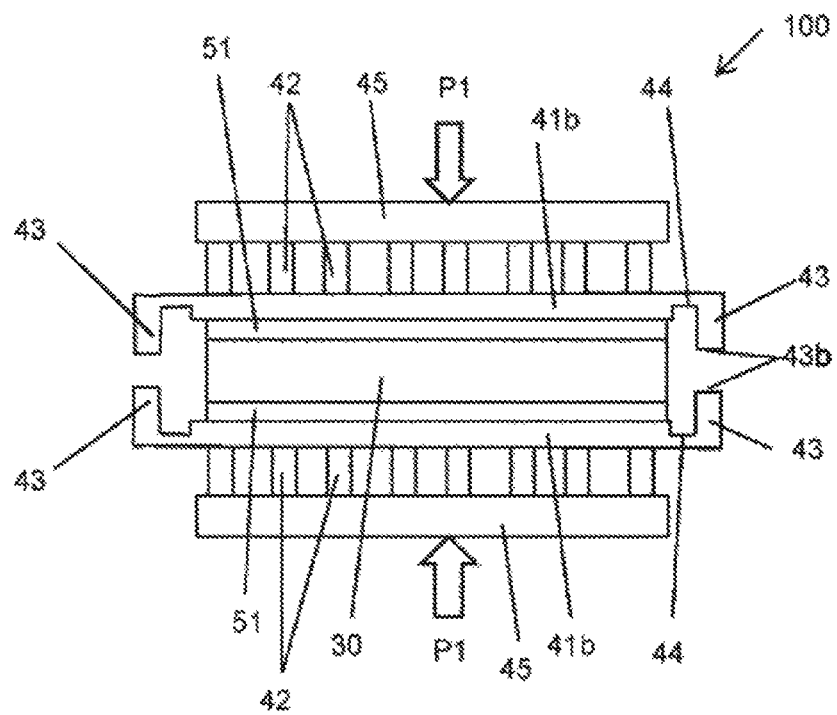
FIG. 8 is a view illustrating a part of a manufacturing process for the power module illustrated in FIG. 6.
Figure 9:
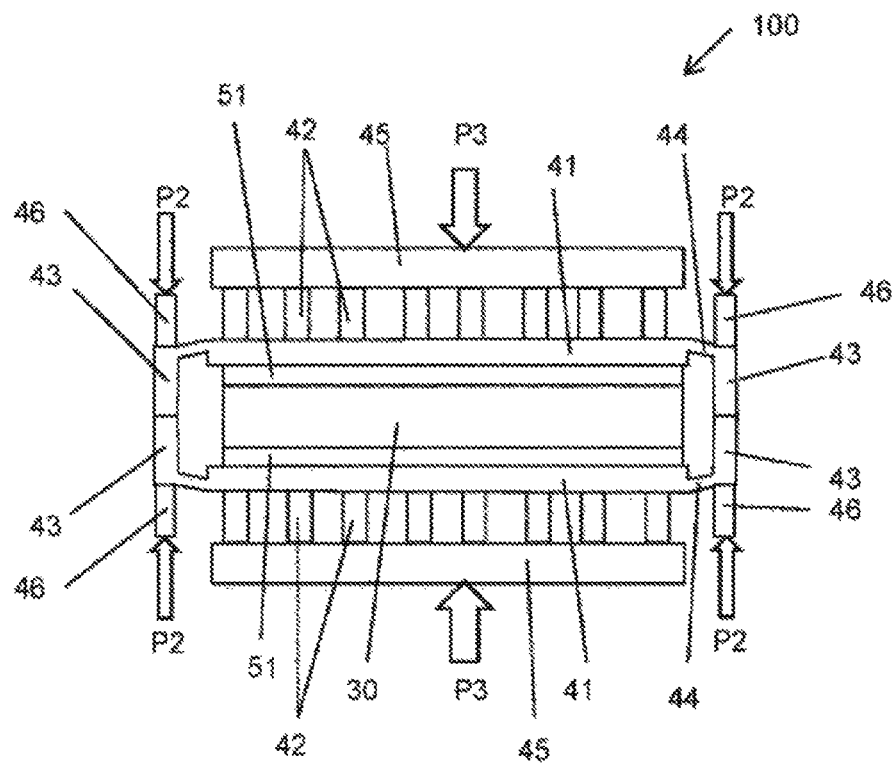
FIG. 9 is a view illustrating another part of the manufacturing process for the power module illustrated in FIG. 6.
Figure 10:
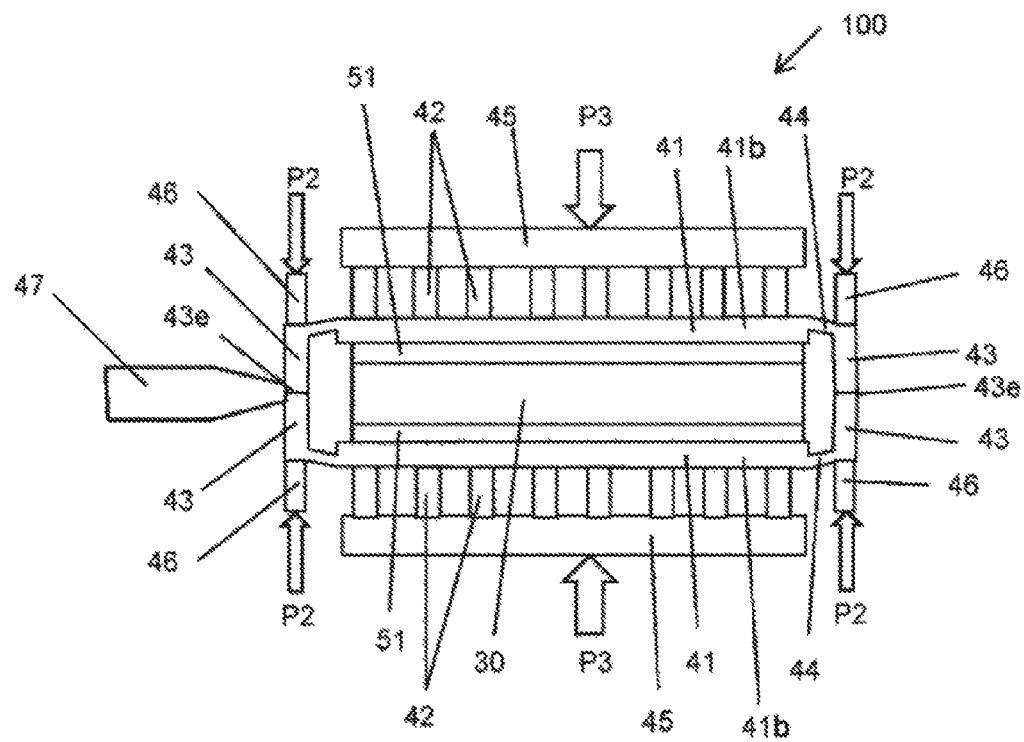
FIG. 10 is a view illustrating another part of the manufacturing process for the power module illustrated in FIG. 6.

FIG. 3 is an outer plan view of one of the power modules 100 according to the one embodiment of the present invention. FIG. 4 is an outer side view of the power module 100 according to the one embodiment of the present invention. FIG. 5 is a longitudinal sectional view taken along line A-A' of the power module 100 illustrated in FIG. 3. FIG. 6 is a cross sectional view taken along line B-B' of the power module 100 illustrated in FIG. 3. FIG. 7 is an exploded sectional view of the power module 100 illustrated in FIG. 6. Furthermore, FIGS. 8 to 10 are views illustrating different parts of a manufacturing process of the power module 100 illustrated in FIG. 6.

Figure 13:
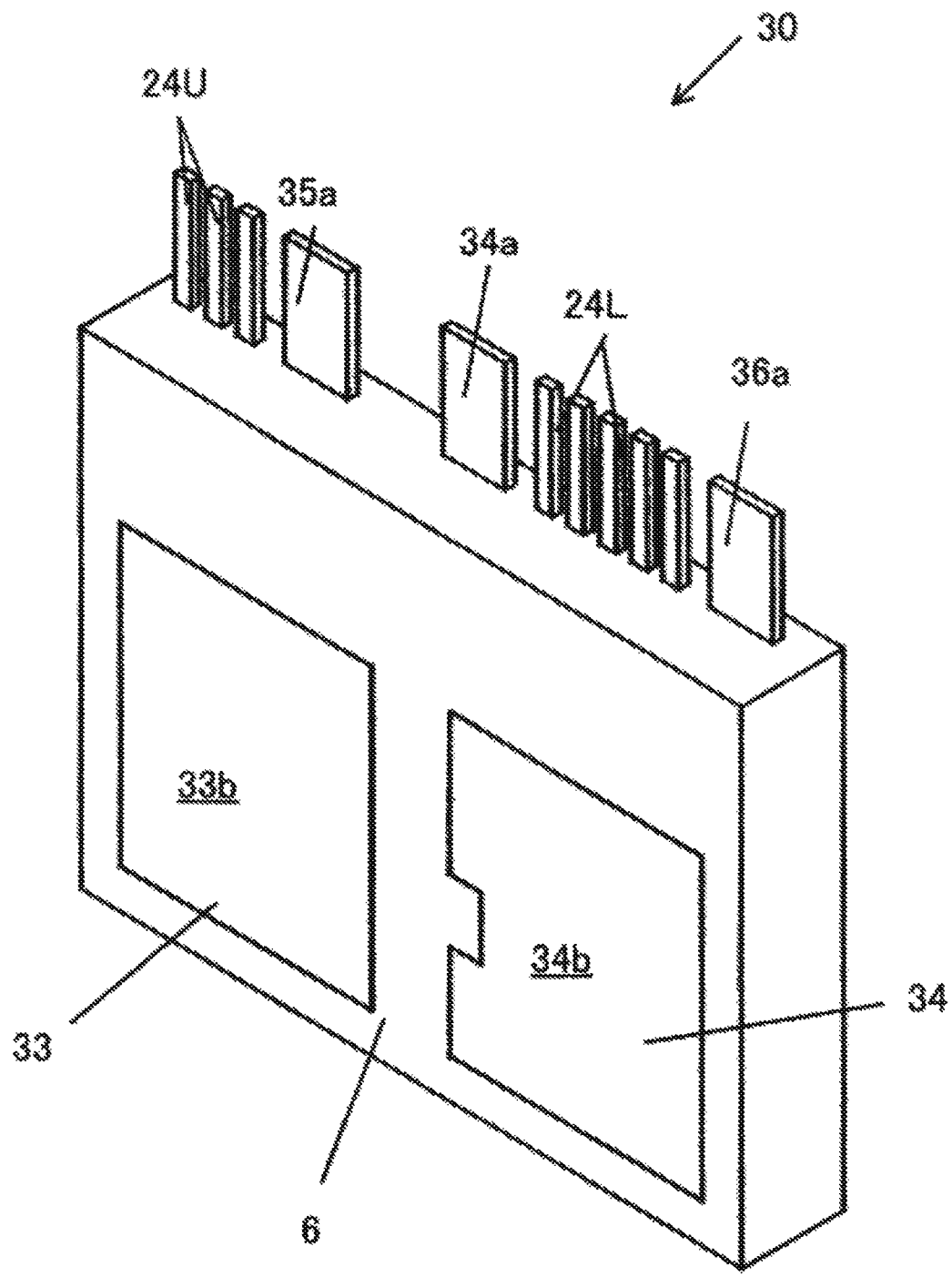
FIG. 13 is an outer perspective view of a power semiconductor module to be housed in a power module, viewed from the side of a front surface.
Figure 14:
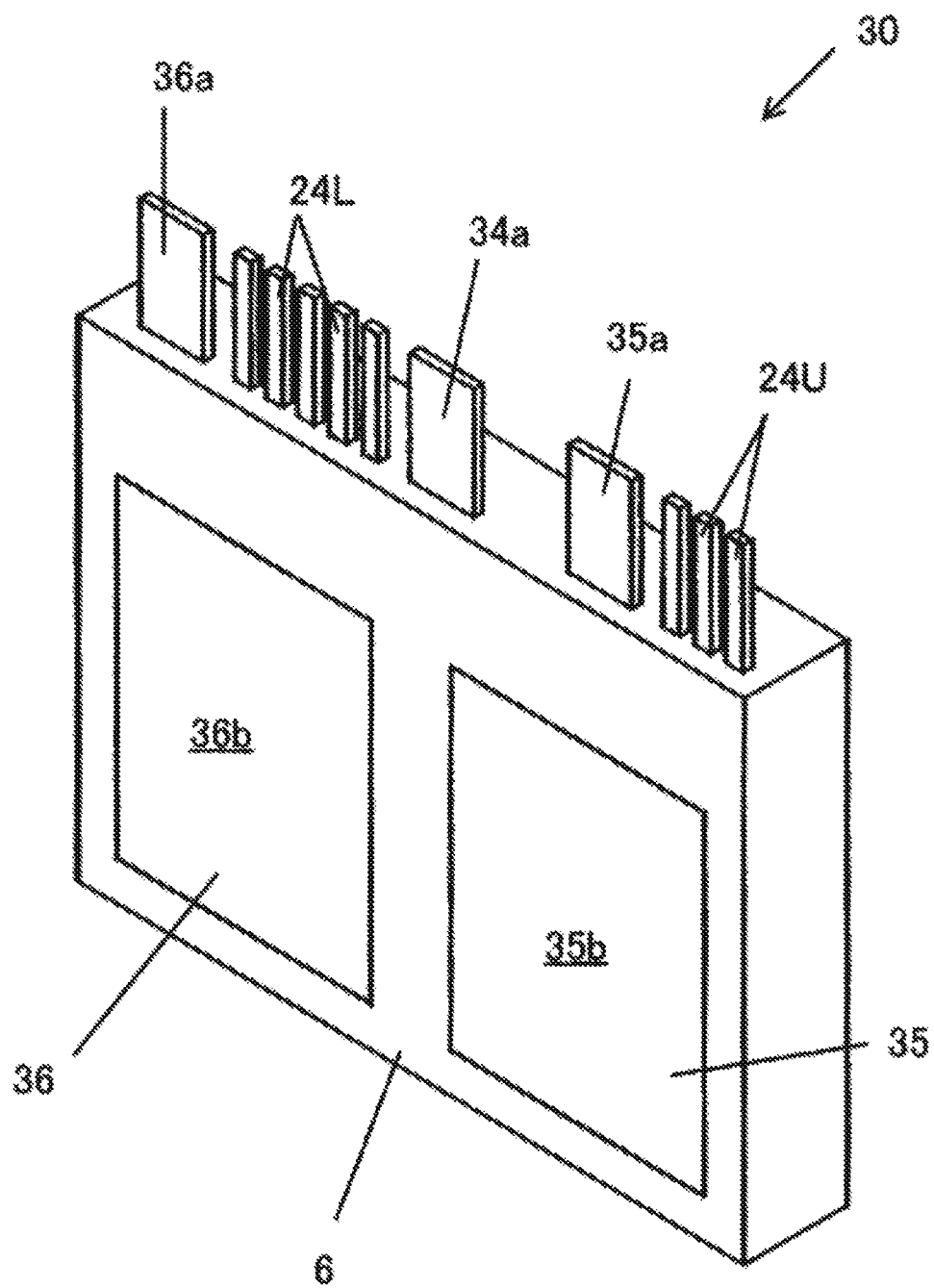
FIG. 14 is an outer perspective view of the power semiconductor module to be housed in the power module, viewed from the side of a back surface.
Figure 15:
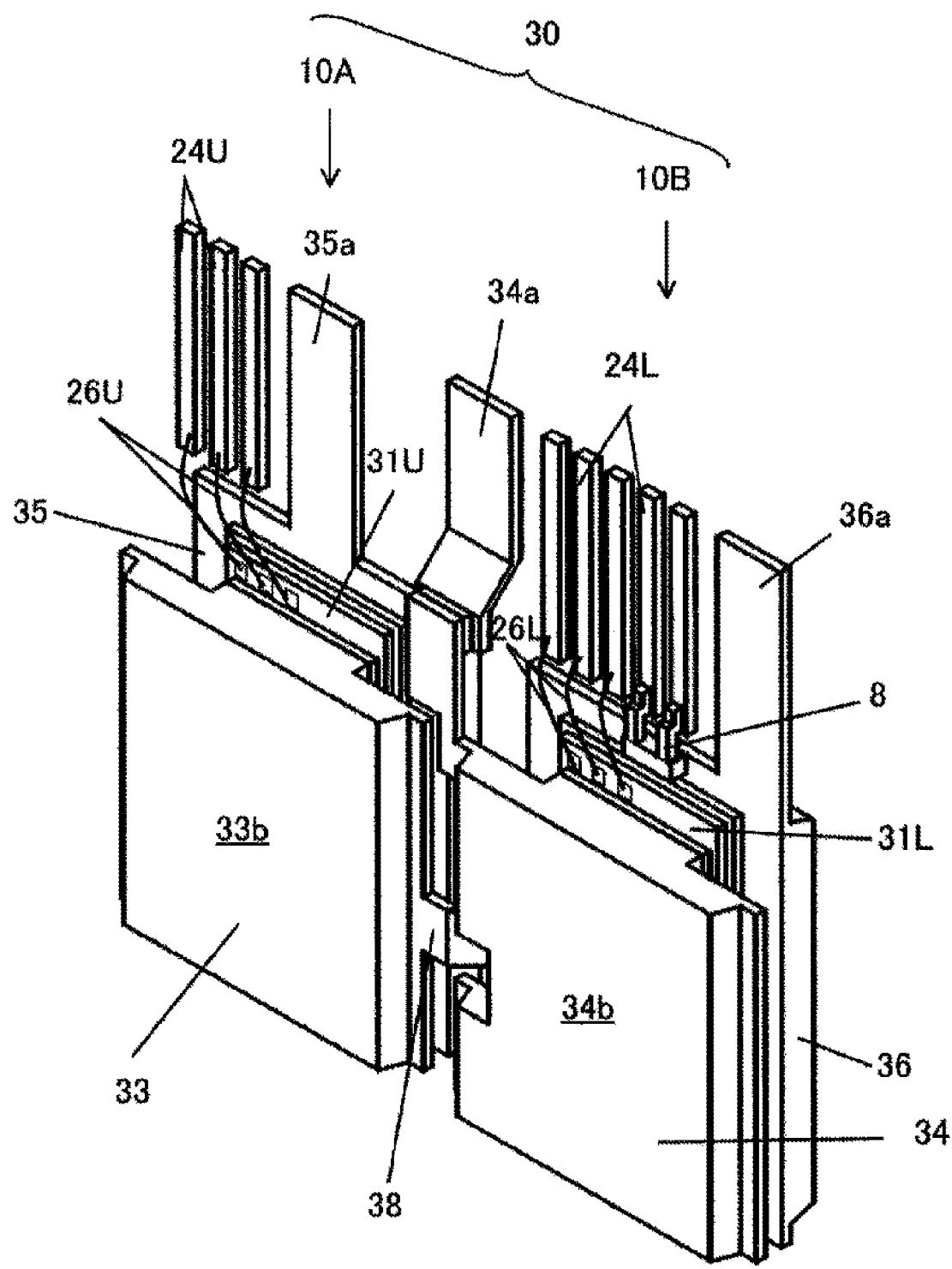
FIG. 15 is a perspective view in a state where sealing resin of the power semiconductor module illustrated in FIG. 14 has been removed.
Figure 16:
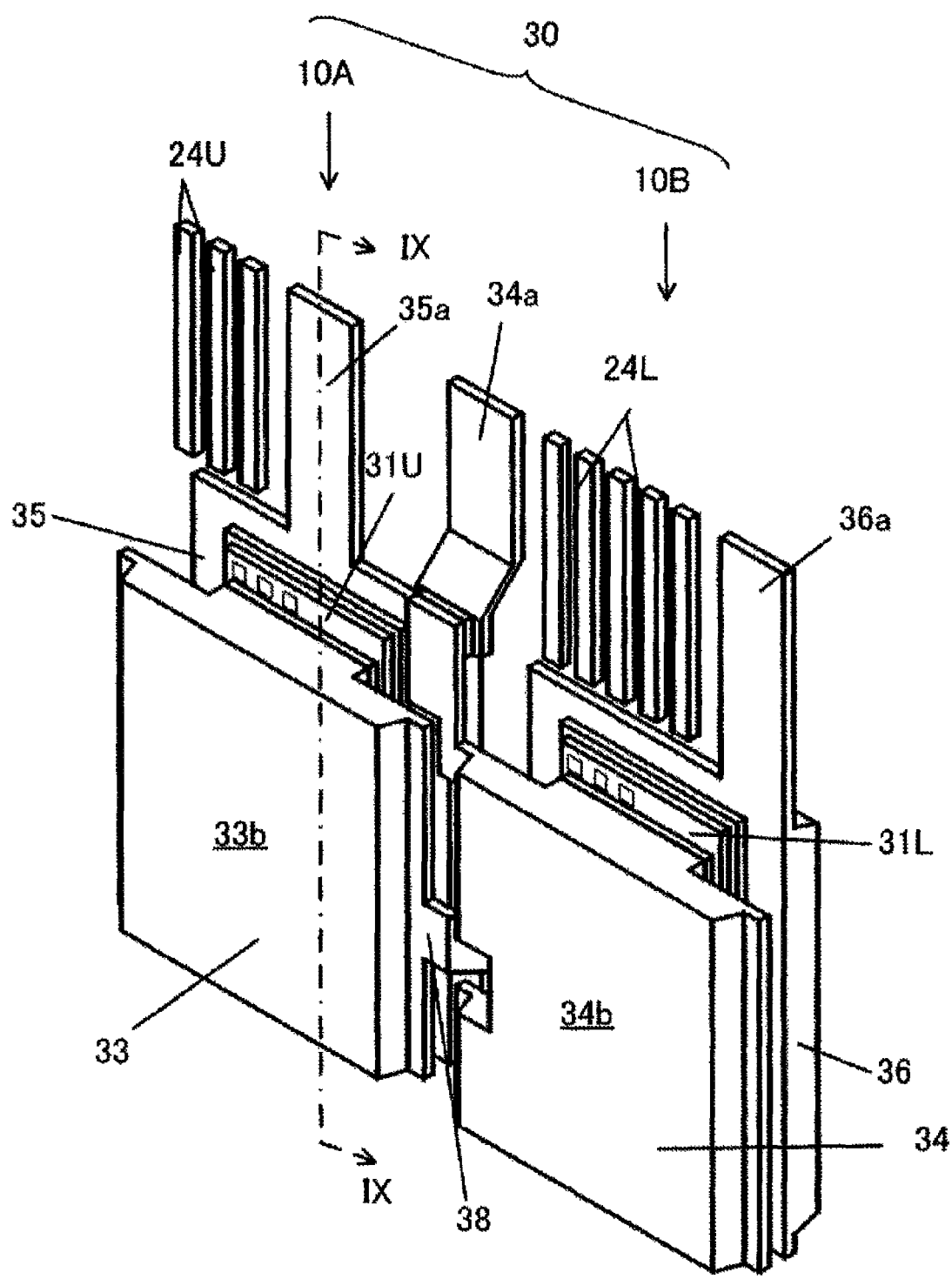
FIG. 16 is a perspective view before wire bonding is performed between electrode terminals and power semiconductor elements in the power semiconductor module illustrated in FIG. 16.
Figure 17:
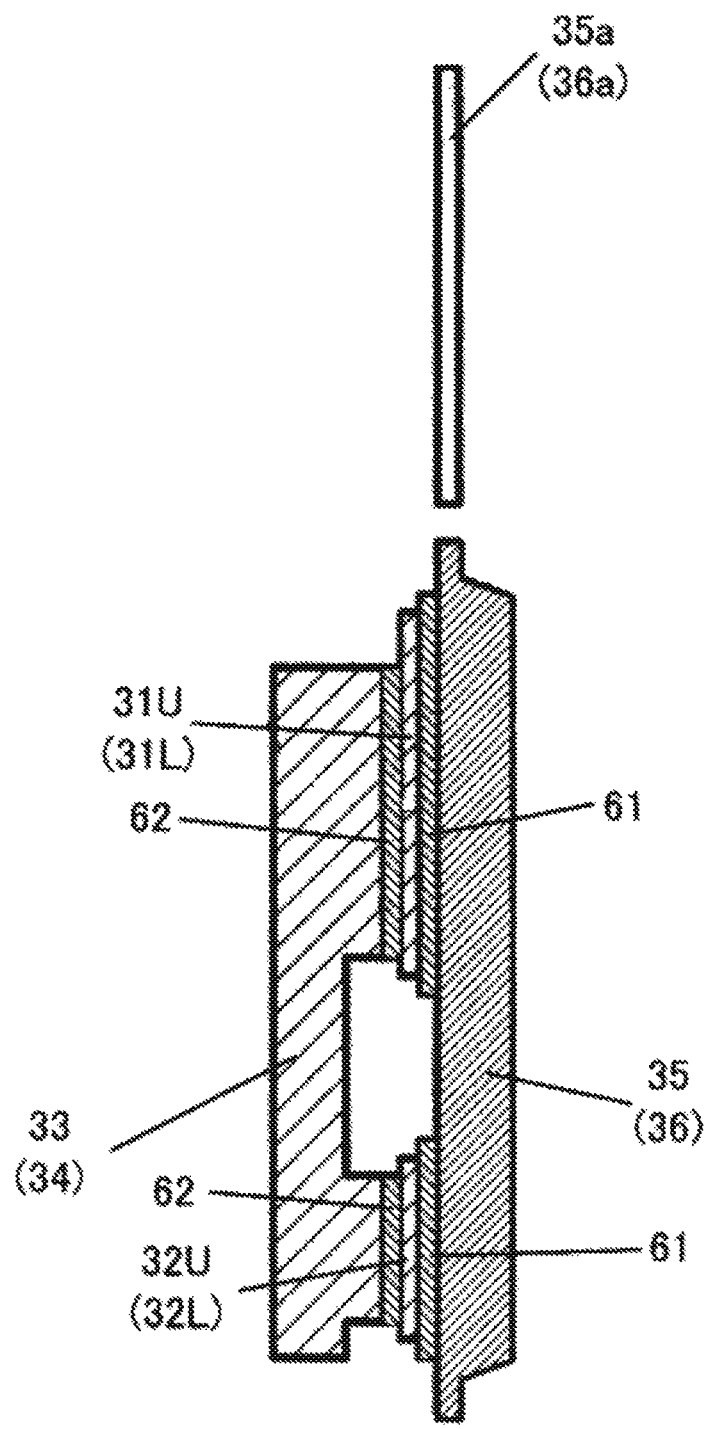
FIG. 17 is a sectional view taken along line IX-IX of a power semiconductor unit illustrated in FIG. 17.

Furthermore, FIG. 13 is an outer perspective view of power semiconductor units to be housed in the power module 100, viewed from the side of a front surface. FIG. 14 is an outer perspective view of the power semiconductor units, viewed from the side of a back surface. FIG. 15 is a perspective view in a state where sealing resin of the power semiconductor units illustrated in FIG. 13 has been removed. FIG. 16 is a perspective view before wire bonding is performed between electrode terminals and a power semiconductor element in each of the power semiconductor units illustrated in FIG. 15. Furthermore, FIG. 17 is a sectional view taken along line IX-IX of a power semiconductor unit 10A illustrated in FIG. 16. Note that, reference signs for members of a power semiconductor unit 10B corresponding to those of the power semiconductor unit 10A, are also added in FIG. 17.

As illustrated in FIGS. 5 and 6, the power module 100 including a power semiconductor module 30 having a switching element, to which transfer molding has been performed, housed in a metal-made case 40 that is a CAN cooler. Here, the CAN-typed cooler is a cooler having a flat and cylindrical shape, with an insertion opening 17 on one side and a bottom on the other side. The metal-made case 40 is formed of a member having electric conduction, such as a composite material of Cu, Cu alloy, Cu—C, or Cu—CuO, or a composite material of Al, Al alloy, AlSiC, or Al—C.

The power semiconductor module 30 functions as a circuit body including the power semiconductor elements and conductive plates, to be described later, modularized.

As illustrated in FIGS. 3 and 4, the metal-made case 40 includes a pair of heat dissipating members 41 each having a plurality of heat dissipating fins 42. The pair of heat dissipating members 41 functions as a first case portion and a second case portion forming a housing space for the power semiconductor module 30.

Here, each of the heat dissipating members 41 is integrally formed with a sealing portion 11 in a region on the side close to the opening of the metal-made case 40, having the heat dissipating fins 42 on a base portion 41b. Note that the base portions 41b also function as base portions that sandwich the power semiconductor module 30.

As illustrated in FIGS. 5 and 6, a side wall portion 43 for forming a side wall of the metal-made case 40 is integrally formed in a region in which the sealing portion 11 of each of the heat dissipating members 41 is not formed.

A deforming portion 44 is formed to each of the heat dissipating members 41 so as to surround the periphery of the base portion 41b. The deforming portion 44 also couples the base portion 41b and the side wall portion 43.

The deforming portion 44 is characterized in that the rigidity is smaller than that of the base portion 41b. For example, as illustrated in FIGS. 5 and 6, a structure including the thickness of the deforming portion 44 thinner than the thickness of the base portion 41b, can be made. For example, a recess portion 44b is provided on a surface of each of the heat dissipating members 41, on the side to be in contact with the power semiconductor module 30. Thus, the deforming portion 44 thinner than the base portion 41b can be formed.

The pair of heat dissipating members 41 is joined at the respective side wall portions 43. Examples of the joining that can be applied include friction stir welding (FSW), laser welding, and brazing. With the metal-made case having this type of shape, even when the power module 100 is inserted into a channel through which a coolant, such as water, oil, or organic matter, flows, the simple structure can prevent the cooling medium from entering the inside of the power module 100.

As illustrated in FIGS. 5 and 6, a heat conductive insulating layer 51 is interposed between the power semiconductor module 30 housed in the metal-made case 40 and each of the pair of base portions 41b. The insulating layers 51 conduct heat generated from the power semiconductor module 30, to the heat dissipating members 41b. The insulating layers 51 are formed of a material having high heat conductivity and large dielectric strength. For example, a thin film of aluminum oxide (alumina) or aluminum nitride, or an insulating sheet or an adhesive, including impalpable powder thereof, can be used. To be described later, the conductive plates 33 to 36 (refer to FIGS. 13 and 14) to which the power semiconductor elements are soldered, are exposed on both front and back surfaces of the power semiconductor module 30. The insulating layers 51 couple the conductive plates 33 to 36 and the heat dissipating members 41b so that heat conduction can be performed.

Gaps of the metal-made case 40 and the insulating layers 51 with respect to the power semiconductor module 30 are filled with second sealing resin 49.

[Power Semiconductor Module 30]

As illustrated in FIGS. 16 and 17, the conductive plate 33 on the side of an alternating-current output and the conductive plate 34 on the side of a direct-current negative electrode are arranged on the same plane on the side of the front surface of the power semiconductor module 30.

As illustrated in FIG. 13, the first sealing resin 6 exposes an upper surface 33b of the conductive plate 33 and an upper surface 34b of the conductive plate 34, and covers the entire periphery of the conductive plates 33 and 34 on the side of the front surface of the power semiconductor module 30. A surface of the first sealing resin 6 is flush with the upper surface 33b of the conductive plate 33 and the upper surface 34b of the conductive plate 34.

As illustrated in FIGS. 16 and 17, the conductive plate 35 on the side of a direct-current electrode and the conductive plate 36 on the side of the alternating-current output are arranged on the same plane on the side of the back surface of the power semiconductor module 30.

As illustrated in FIG. 14, the first sealing resin 6 exposes an upper surface 35b of the conductive plate 35 and an upper surface 36b of the conductive plate 36, and covers the entire periphery of the conductive plates 35 and 36 on the side of the back surface of the power semiconductor module 30. Another surface of the first sealing resin 6 is flush with the upper surface 35b of the conductive plate 35 and the upper surface 36b of the conductive plate 36.

The conductive plates 33 to 36 are formed of, for example, copper, copper alloy, aluminum, or aluminum alloy.

As illustrated in FIG. 17, each of the power semiconductor element 31U and a diode 32U is attached between the conductive plate 35 and the conductive plate 33 through a solder material 61 on one side and through a solder material 62 on the other side. Similarly, each of the power semiconductor element 31L and a diode 32L is attached between the conductive plate 36 and the conductive plate 34 through solder materials 61 and 62 on one side and the other side, respectively.

Figure 18:
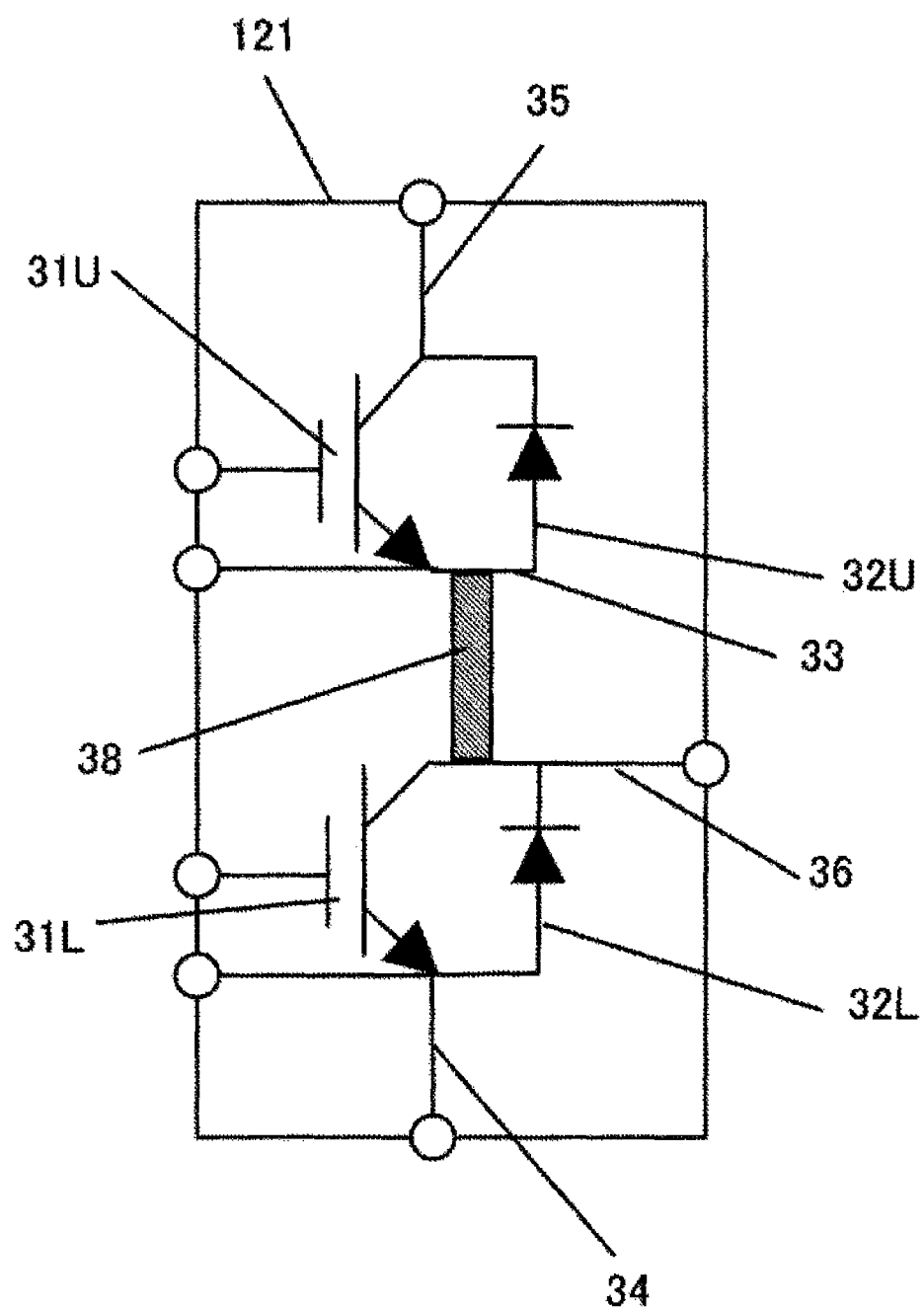
FIG. 18 is a circuit diagram built in a power semiconductor module according to one embodiment of the present invention.

FIG. 18 is a circuit diagram of a circuit built in the power semiconductor module 30 according to the one embodiment. The following descriptions will be given with reference to the drawings together with the circuit diagram. The power semiconductor element 31U, the diode 32U, the power semiconductor element 31L, and the diode 32L are included in an upper-and-lower-arm series circuit 121.

As illustrated in FIG. 15, the direct-current positive electrode terminal 35a is formed on the conductive plate 35 on the side of the direct-current electrode, and an alternating-current output terminal 36a is formed on the conductive plate 36 on the side of the alternating-current output. Bonding is performed to the power semiconductor element 31U and the diode 32U with respect to the conductive plate 35 on the side of the direct-current positive electrode so that an upper arm circuit is configured. Input and output portions of the power semiconductor element 31U are coupled to a plurality of signal terminals 24U through wires 26U.

As illustrated in FIG. 15, bonding is performed to the power semiconductor element 31L and the diode 32L with respect to the conductive plate 36 on the side of the alternating-current output so that a lower arm circuit is configured 26U. Input and output portions of the power semiconductor element 31L are coupled to a plurality of signal terminals 24L through wires 26L.

As illustrated in FIGS. 15 and 16, the conductive plate 35, the conductive plate 33, the direct-current positive electrode terminal 35a, the signal terminals 24U, the power semiconductor element 31U, and the diode 32U are included in the power semiconductor unit 10A. The conductive plate 36, the conductive plate 34, the alternating-current output terminal 36*a*, signal terminals 24L, the power semiconductor element 31L, and the diode 32L are included in the power semiconductor unit 10B.

As illustrated in FIG. 15, a lead 38 is integrally formed with the conductive plate 33. A leading end of the lead 38 is coupled to the conductive plate 36. Accordingly, the power semiconductor unit 10A and the power semiconductor unit 10B are coupled to each other. The power semiconductor unit 10B includes a temperature sensor 8 (refer to FIG. 15) for detecting the temperature of the conductive plate 36, namely, the temperature of the power semiconductor element 31L.

As illustrated in FIGS. 13 and 14, the power semiconductor module 30 has a structure including the power semiconductor unit 10A and the power semiconductor unit 10B that have been sealed with the first sealing resin 6, and the direct-current positive electrode terminal 35*a*, the signal terminals 24U, the alternating-current output terminal 36*a*, and the signal terminals 24L that have been sealed with the second sealing resin 15 so as to be exposed from the periphery of the first sealing resin 6.

[Method of Manufacturing the Power Module 100]

As illustrated in FIGS. 13 and 14, the power semiconductor unit 10A and the power semiconductor unit 10B are sealed with the first sealing resin 6 so that the power semiconductor module 30 is formed.

As illustrated in FIG. 7, the insulating layers 51 are formed on both of the front and back surfaces of the power semiconductor module 30, namely, on one side on which the upper surface 33*b* of the conductive plate 33 and the upper surface 34*b* of the conductive plate 34 have been exposed and on the other side on which the upper surface 35*b* of the conductive plate 35 and the upper surface 36*b* of the conductive plate 36 have been exposed. For example, a method of sticking an insulating sheet, or a method of applying an insulating adhesive can be used for the formation of the insulating layers 51.

A manufacturing process until the above power semiconductor module 30 and insulating layers 51 are housed in the metal-made case 40, will be described with FIGS. 7 to 10.

FIG. 7 illustrates a state before the power semiconductor module 30 and the insulating layers 51 are sandwiched by the pair of heat dissipating members 41.

A surface 41*a* is a predetermined surface of one of the heat dissipating members 41, to be contacted with one of the insulating layers 51. A surface 43*b* is a predetermined surface to be coupled to the side wall portion 43 of the other heat dissipating member 41. A distance between the surface 41*a* and the surface 43*b* is defined as t1.

Similarly, a surface 41*c* is a predetermined surface of the other heat dissipating member 41 to be contacted with the other insulating layer 51. A surface 43*c* is a predetermined surface to be coupled to the side wall portion 43 of the one of the heat dissipating members 41. A distance between the surface 41*c* and the surface 43*c* is defined as t2.

The total thickness of the power semiconductor module 30 and the insulating layers 51 is defined as t3.

The side wall portions 43 of the pair of heat dissipating members 41 are formed so that the sum of the distance t1 and the distance t2 in length is shorter than the total thickness t3 of the power semiconductor module 30 and the insulating layers 51. Accordingly, the heat dissipating members 41 can cause compressive stress to remain in the power semiconductor module 30 and the insulating layers 51. The deforming portions 44 having rigidity smaller than that of the base portions 41*b* are provided between the side wall portions 43 and the base portions 41*b*. Thus, deformation of the deforming portions 44 can absorb variation of processing dimensions of the power semiconductor module 30.

As illustrated in FIG. 8, for example, pressing jigs 45 make pressurization P1 to the base portions 41*b* of the pair of heat dissipating members 41 so as to press the power semiconductor module 30 from the outside. The pressurization attaches the power semiconductor module 30 and the base portions 41*b* on the front and back sides thereof through the insulating layers 51. The pressurization may attach the pair of base portions 41*b* at once, or may attach the base portions 41*b* one by one.

After that, as illustrated in FIG. 9, second pressing jigs 46 make pressurization P2 from the outsides of the side wall portions 43 of the pair of heat dissipating members 41. Thus, the deforming portions 44 deform so that the surfaces 43*b* to be coupled to each other of the side wall portions 43 of the pair of heat dissipating members 41 are in contact.

After that, as illustrated in FIG. 10, joining is made at coupling portions 43*e* of the respective side wall portions 43 of the pair of heat dissipating members 41. Examples of the joining that can be applied include friction stir welding (FSW), laser welding, and brazing. FIG. 10 illustrates an exemplary state where the joining is made by thrusting a tool 47 of the friction stir welding (FSW).

During the above manufacturing process, the power module 100 illustrated in FIGS. 3 to 6 is formed.

As illustrated in FIG. 6, the power module 100 formed in this manner, has a distance t5 between a surface on which the fins of one of the base portions 41*b* have been formed and a surface on which the fins of the other base portion 41*b* have been formed, larger than a distance t4 between an upper surface 43*d* of one of the side wall portions 43 and an upper surface 43*d* of the other side wall portion 43.

A distance t7 between bases of the respective deforming portions 44 of the pair of heat dissipating members 41, on the sides of the base portions 41*b*, is larger than a distance t6 between bases of the respective deforming portions 44 on the sides of the side wall portions 43.

As illustrated in FIG. 9, when the second pressing jigs 46 press the side wall portions 43 from the outsides and then the deforming portions 44 deform, for example, plastic deformation is performed with the pressing jigs 45 pressing the base portions 41*b*. Thus, the base portions 41*b* can be prevented from rising due to bending deformation.

As illustrated in FIG. 6, the deforming portions 44 are coupled to positions apart from the centers of the base portions 41*b* in a thickness direction so that flexural rigidity (the second moment of area) of the base portions 41*b* increases. Thus, the amount of bending deformation decreases so that an effect of inhibiting the rising near center portions of the base portions 41*b* is acquired.

In particular, the deforming portions 44 are arranged on the sides of fins of the base portions 41*b* in the thickness direction, namely, move away from the power semiconductor module 30 so that tensile stress to be generated at coupling surfaces between the base portions 41*b* and the insulating layers 51 can be reduced even in a case where the second sealing resin 49 expands due to a variation in temperature, such as temperature cycles, and the heat dissipating members 41 receive outward force. Thus, an effect that detachment is inhibited from occurring in interfaces between the insulating layer 51, the conductive plate 33, and the conductive plate 34, is acquired.

According to the above results, causing the compressive stress to remain stably in the insulating sheets of the power module can be made, and the insulating sheets can be prevented from being detached. Therefore, the power module having high reliability can be achieved.

Second Embodiment

Figure 11:
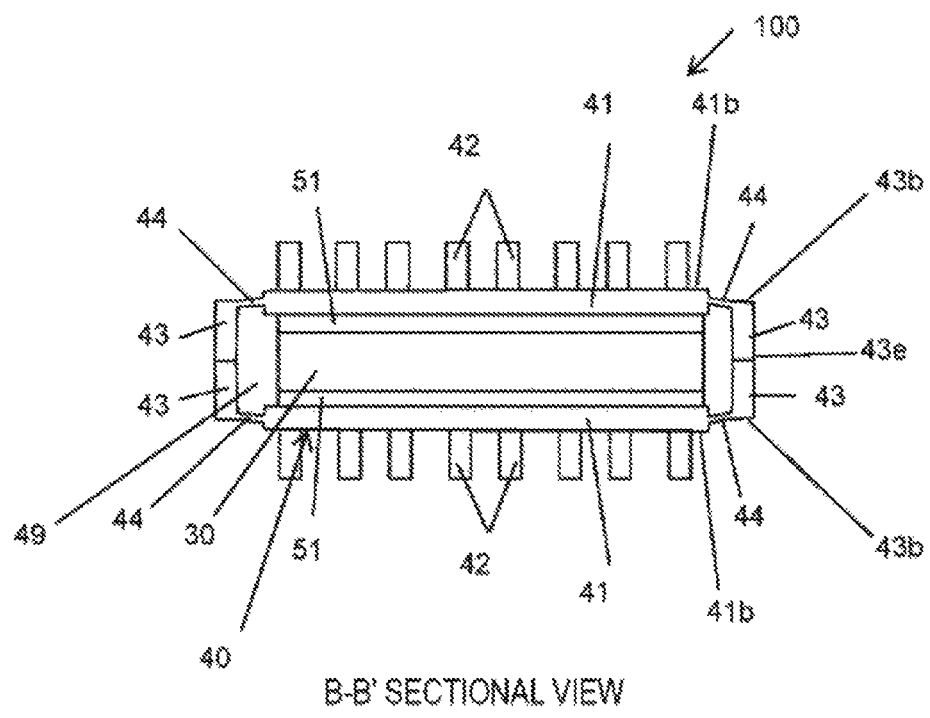
FIG. 11 is a sectional view of a power module according to a second embodiment of the present invention.

FIG. 11 illustrates a modification of the power module illustrated in FIG. 6. Reference signs the same as those in FIG. 6 indicate the same constituent components. Thus, the duplicate detailed descriptions will be omitted.

In the modification illustrated in FIG. 11, deforming portions 44 of heat dissipating members 41b forming a metal-made case 40 are provided near the centers of base portions 41b in a thickness direction.

Accordingly, flexural rigidity (the second moment of area) of fin bases decreases. Thus, during the use of the power module, an effect of inhibiting tensile stress from occurring in the deforming portions 44 is acquired and an effect of inhibiting fatigue failures from occurring in the deforming portions 44 is acquired even in a case where bending deformation occurs in the base portions 41b or even in a case where outward deformation has been made.

Third Embodiment

Figure 12:
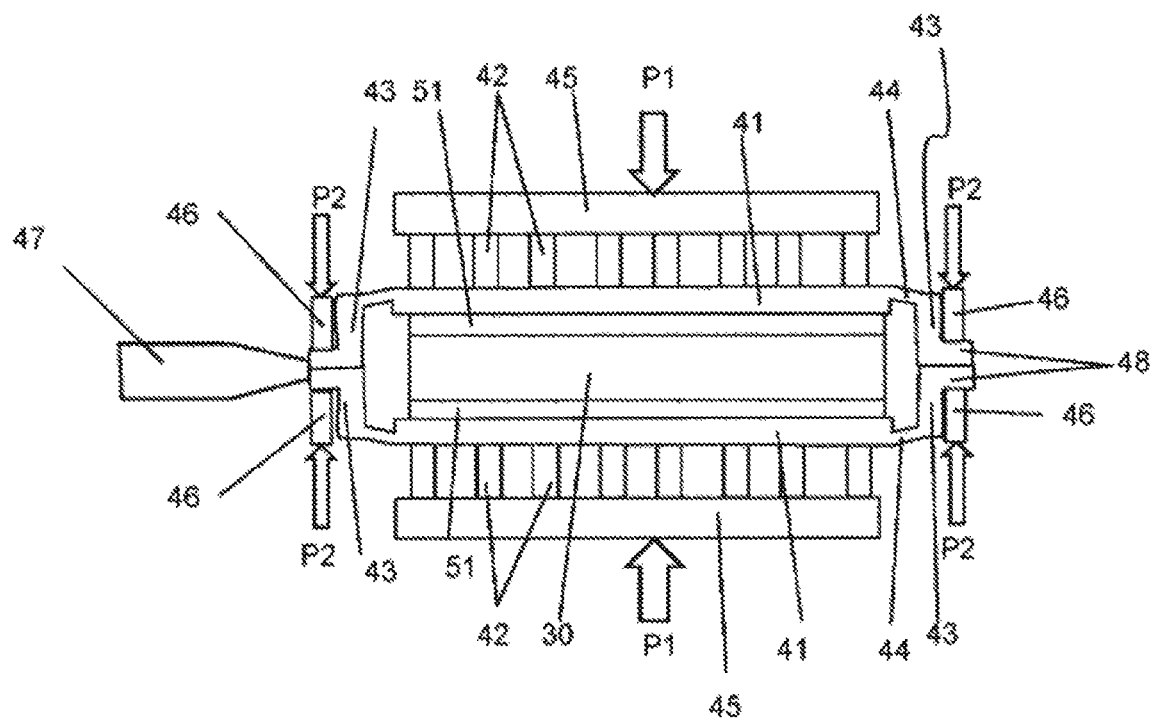
FIG. 12 is a sectional view of a power module according to a third embodiment of the present invention.

FIG. 12 illustrates another modification of the power module of the power conversion device illustrated in FIG. 6. Reference signs the same as those in FIG. 6 indicate the same constituent components. Thus, the duplicate detailed descriptions will be omitted.

In the modification illustrated in FIG. 12, protruding portions 48 are provided to side wall portions 43 of heat dissipating members 41 forming a metal-made case 40. The protruding portions 48 are formed so as to protrude in a direction that moves away from the metal-made case 40. When the side wall portions 43 of the pair of heat dissipating members 41 are joined, an effect that pressurization is easily performed by second pressing jigs 46, is acquired. In a case where the joining is performed by FSW, rigidity of coupling portions is secured and coupling is made to be easy. In addition, an effect of inhibiting heat generated at a leading end of a tool from being transmitted to coupling interfaces between insulating layers 51 and a power semiconductor module 30, is acquired.

In the embodiments described above, the manufacturing process of performing the sandwiching with the heat dissipating portions 41b after the insulating layers 51 are formed on the power semiconductor module 30, has been exemplified. However, the insulating layers 51 are not necessarily formed on the side of the power semiconductor module 30, and may be previously provided on the side of the heat dissipating members 41.

In the embodiment described above, a pin fin is applied to the shape of each of the heat dissipating fins 42 of the heat dissipating members 41. However, other shapes, such as a straight fin and a corrugated fin, may be applied.

In the embodiments described above, the exemplary vehicular power conversion device with which an electric motor vehicle or a hybrid motor vehicle is equipped, has been described. The present invention can be similarly applied to a power conversion device having a cooling structure including a power module that is immersed in a cooling medium.

In addition, the present invention is not limited to the above embodiments. Various modifications can be made and applied within the scope of the spirit of the present invention.

REFERENCE SIGNS LIST

6 . . . first sealing resin, 8 . . . temperature sensor, 10A . . . power semiconductor unit, 10B . . . power semiconductor unit, 11 . . . sealing portion, 17 . . . insertion opening, 30 . . . power semiconductor module, 31U . . . power semiconductor element, 31L . . . power semiconductor element, 32U . . . diode, 32L . . . diode, 33 . . . conductive plate, 33b . . . upper surface, 34 . . . conductive plate, 34b . . . upper surface, 35 . . . conductive plate, 35a . . . direct-current positive electrode terminal, 35b . . . upper surface, 36 . . . conductive plate, 36a . . . alternating-current output terminal, 36b . . . upper surface, 38 . . . lead, 24L . . . signal terminal, 24U . . . signal terminal, 26L . . . wire, 26U . . . wire, 40 . . . metal-made case, 41 . . . heat dissipating member, 41a . . . surface, 41b . . . base portion, 41c . . . surface, 42 . . . heat dissipating fin, 43 . . . side wall portion, 43b . . . surface, 43c . . . surface, 43d . . . upper surface, 43e . . . coupling portion, 44 . . . deforming portion, 44b . . . recess portion, 45 . . . pressing jig, 46 . . . second pressing jig, 47 . . . tool, 48 . . . protruding portion, 49 . . . second sealing resin, 51 . . . insulating layer, 61 . . . solder material, 62 . . . solder material, 100 . . . power module, 121 . . . upper-and-lower arm series circuit, 200 . . . power conversion device, 201 . . . housing main body, 202 . . . bottom cover, 203a . . . inlet pipe, 203b . . . outlet pipe, 210 . . . cooling chamber, 211 . . . peripheral wall, 221 . . . side wall, 220 . . . supporting member, 231 . . . sealing member, 240 . . . covering member, 250 . . . capacitor module, 251 . . . capacitor element, 261 . . . direct-current side bus bar assembly, 262 . . . control circuit board assembly, 263 . . . alternating-current side bus bar assembly, t1 . . . distance, t2 . . . distance, t3 . . . thickness, t4 . . . distance, t5 . . . distance, t6 . . . distance, t7 . . . distance, P1 . . . pressurization, P2 . . . pressurization

The invention claimed is:
1. A power module comprising:
a circuit body having a power semiconductor element; and
a case housing the circuit body,
wherein the case has:
a first case member including a first base plate facing one surface of the circuit body; and
a second case member including a second base plate facing another surface on a side opposite to the one surface of the circuit body,
the first case member has a first side wall portion formed in an arrangement direction of the first base plate and the second base plate,
the second case member has a second side wall portion formed in the arrangement direction, the second side wall portion coupling to the first side wall portion,
the first side wall portion and the second side wall portion are formed so as to have a sum of lengths of the first side wall portion and the second side wall portion in the arrangement direction smaller than a thickness of the circuit body, and
the first case member has a deforming portion smaller than the first base plate and the second base plate in rigidity.

2. The power module according to claim 1,
wherein a thickness of the deforming portion is smaller than a thickness of the first base portion.

3. The power module according to claim 1,
wherein the deforming portion is coupled to a position apart from a center of the first base plate in a thickness direction.

4. The power module according to claim 3, wherein the first base plate includes a fin formed on a surface on a side on which the circuit body is arranged, and the coupling position between the deforming portion and the first base plate.

5. The power module according to claim 1,
wherein the deforming portion is coupled to a center position of the first base plate in a thickness direction.

6. The power module according to claim 1,
wherein the first side wall portion and the second side wall portion are formed so as to have a distance between a surface of the first base portion and a surface of the second base portion larger than the sum of the lengths of the first side wall portion and the second side wall portion.

7. The power module according to claim 1,
wherein the first side wall portion has a first protruding portion protruding in a direction moving away from the circuit body,
the second side wall portion has a second protruding portion protruding in a direction moving away from the circuit body, the second protruding portion being in contact with the first protruding portion, and
the first protruding portion is joined to the second protruding portion.

* * * * *